(12) United States Patent
Schultz

(10) Patent No.: US 10,991,639 B2
(45) Date of Patent: Apr. 27, 2021

(54) COMPLIANT PIN FIN HEAT SINK WITH BASE INTEGRAL PINS

(71) Applicant: International Business Machines Corporation, Armonk, NY (US)

(72) Inventor: Mark D. Schultz, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 15/088,400

(22) Filed: Apr. 1, 2016

(65) Prior Publication Data
US 2017/0287809 A1 Oct. 5, 2017

(51) Int. Cl.
| | |
|---|---|
| *H01L 23/367* | (2006.01) |
| *H01L 23/473* | (2006.01) |
| *H01L 21/48* | (2006.01) |
| *H05K 1/02* | (2006.01) |

(52) U.S. Cl.
CPC ...... *H01L 23/3677* (2013.01); *H01L 21/4875* (2013.01); *H01L 21/4878* (2013.01); *H01L 23/473* (2013.01); *H05K 1/0203* (2013.01)

(58) Field of Classification Search
CPC ............ H01L 21/4875; H01L 23/3677; H01L 23/473; H05K 1/0203; H05K 7/20236; H05K 7/20254; F28F 3/022; F28F 21/085; F28F 2255/02; F28D 15/00; F28D 2021/0029
See application file for complete search history.

(56) References Cited

U.S. PATENT DOCUMENTS

| | | | | |
|---|---|---|---|---|
| 5,168,348 | A | * | 12/1992 | Chu ................... H01L 23/3677 257/713 |
| 5,369,301 | A | * | 11/1994 | Hayashi ............. H01L 23/3677 165/80.3 |
| 6,367,541 | B2 | * | 4/2002 | McCullough ....... H01L 23/3737 165/185 |
| 6,549,411 | B1 | | 4/2003 | Herbert |
| 6,919,504 | B2 | | 7/2005 | McCutcheon et al. |
| 6,982,877 | B2 | | 1/2006 | Vinson et al. |
| 7,215,545 | B1 | * | 5/2007 | Moghaddam ....... H01L 23/3732 165/185 |
| 7,264,041 | B2 | | 9/2007 | Karidis et al. |
| 7,265,976 | B1 | * | 9/2007 | Knight .................. H01L 23/473 257/714 |
| 7,355,855 | B2 | | 4/2008 | Karidis et al. |
| 7,399,919 | B2 | | 7/2008 | McCutcheon et al. |
| 7,545,647 | B2 | | 6/2009 | Karidis et al. |
| 7,545,648 | B2 | | 6/2009 | Karidis et al. |
| 7,755,895 | B2 | * | 7/2010 | Ikeda ..................... H01L 23/36 165/185 |
| 7,849,914 | B2 | | 12/2010 | Di Stefano et al. |
| 8,069,907 | B2 | | 12/2011 | Bryant et al. |

(Continued)

*Primary Examiner* — Eric S Ruppert
*Assistant Examiner* — Hans R Weiland
(74) *Attorney, Agent, or Firm* — Daniel Morris; Otterstedt, Wallace & Kammer, LLP

(57) ABSTRACT

A compliant pin fin heat sink includes a flexible base plate having a thickness of from about 0.2 mm to about 0.5 mm. A plurality of pins extends from the flexible base plate and is formed integral with the flexible base plate by forging. A flexible top plate is connected to and spaced from the flexible base plate. The plurality of pins is disposed between the flexible base plate and the flexible top plate.

10 Claims, 7 Drawing Sheets

(56) References Cited

U.S. PATENT DOCUMENTS

| | | | |
|---|---|---|---|
| 8,736,048 B2* | 5/2014 | Schultz | H01L 23/46 |
| | | | 257/679 |
| 2004/0118579 A1* | 6/2004 | McCutcheon | H01L 23/3735 |
| | | | 174/16.3 |
| 2004/0150956 A1* | 8/2004 | Conte | H01L 23/3677 |
| | | | 361/709 |
| 2005/0061473 A1 | 3/2005 | Fletcher et al. | |
| 2005/0270744 A1* | 12/2005 | Farrow | H01L 23/42 |
| | | | 361/704 |
| 2006/0191675 A1 | 8/2006 | Fletcher et al. | |
| 2007/0256810 A1 | 11/2007 | Di Stefano et al. | |
| 2008/0282542 A1 | 11/2008 | McCutcheon et al. | |
| 2009/0114372 A1* | 5/2009 | Ippoushi | F28F 3/12 |
| | | | 165/104.14 |
| 2009/0145581 A1* | 6/2009 | Hoffman | F28F 3/022 |
| | | | 165/80.3 |
| 2010/0064518 A1* | 3/2010 | Lower | H01L 23/36 |
| | | | 29/890.039 |
| 2010/0065256 A1* | 3/2010 | Wilcoxon | F28F 21/089 |
| | | | 165/104.31 |
| 2010/0200197 A1 | 8/2010 | Bezama et al. | |
| 2011/0079376 A1* | 4/2011 | Loong | F28F 3/022 |
| | | | 165/185 |
| 2011/0315367 A1* | 12/2011 | Romero | F28F 3/022 |
| | | | 165/185 |
| 2012/0037339 A1 | 2/2012 | Lipp et al. | |
| 2012/0063098 A1* | 3/2012 | Paquette | H05K 7/20254 |
| | | | 361/721 |
| 2012/0085518 A1 | 4/2012 | Ichkahn et al. | |
| 2013/0199767 A1* | 8/2013 | Karidis | B23K 31/02 |
| | | | 165/185 |
| 2015/0008588 A1* | 1/2015 | Kim | H01L 23/373 |
| | | | 257/774 |

* cited by examiner

COMPLIANT PIN FIN HEAT SINK WITH BASE INTEGRAL PINS

STATEMENT REGARDING FEDERALLY SPONSORED RESEARCH OR DEVELOPMENT

This invention was made with Government support under Contract No.: FA8650-09-C-7924 awarded by the Defense Advanced Research Projects Agency (DARPA). The Government has certain rights in this invention.

FIELD OF THE INVENTION

The present invention relates to heat sinks.

BACKGROUND OF THE INVENTION

In order to compensate for deviations from flat contact surfaces, conventional devices for cooling semiconductor components use a relatively thick Thermal Interface Material (TIM) between the surface of the semiconductor component and the rigid heat sink. However, TIM increases thermal resistance and decreases system reliability. Compliant Thermal Interface (CTI) heat sinks have been developed to obviate the need for TIM by providing a heat sink capable of conforming to the existing surface of the semiconductor component. Conventional CTI heat sinks utilize a metal spring layer and have a high associated cost.

As an alternative to CTI heat singe, Compliant Pin Fin (CPF) heat sinks have been proposed and have been demonstrated as effective for direct die attach liquid cooling of high power semiconductor devices. These CPF heat sinks include a relatively thin base plate and a relatively thin top plate, both thin enough to be flexible under the loads applied in a system. These two plates are coupled by an array of pins that conduct heat to a coolant flowing between the two plates. The pins also connect the two plates mechanically.

A construction of the pin fin compliant cold plate is disclosed in U.S. Patent Application Publication No. US2013/0199767 A1, the entire disclosure of which is incorporated herein by reference. However, the disclosed construction has a high associated cost as assembling such heat sinks out of multiple linked sheets is a relatively expensive process. Similar approaches of connecting the pin structure to the bottom plate incur a thermal penalty due to either the material used to connect the pins or voids in the connecting material. The previous constructions also utilize relatively thick sidewalls in the containing structure and function best without intervening structures between and above areas needing to be cooled. Therefore, arrangements of pin fin compliant heat seeks are needed that have a lower associated cost of manufacture and provide improved connection between the flexible base plate and the pin fins

SUMMARY OF THE INVENTION

Systems and methods in accordance with the present invention integrate the pin fin structure into the flexible base plate, which is in contact with the device to be cooled. Therefore, the flexible base plate and pins or pin fins form a unitary structure or single piece. Preferably, the pins are formed in the flexible base plate using a forging process. The pins are surrounded by flow blockers made, for example, of metal or of an elastomer. A flexible top plate is placed over the pins and the flexible base plate. The pins can be spaced from the top plate or in contact with the top plate. In one embodiment, the pins are attached to the flexible top plate using a soldering or brazing process. The flexible top plate includes at least one liquid inlet and at least one liquid outlet for introducing cooling fluid into the space between the flexible top plate and the flexible base plate containing the plurality of pins.

In order to direct the flow through the plurality of pins, the liquid inlet and liquid outlet are located on opposite sides of the plurality of pins, which are arranged in a generally rectangular or square pattern to reasonably match the surface of the device to be cooled. In addition, one or more flow blocking structures are located between the flexible top plate and the flexible base plate and define an active area or flow channel containing the plurality of pins. The flow blocking structures prevent the cooling fluid from by-passing the plurality of pins. In order to accommodate the overall flexibility of the compliant pin fin heat sink, the flow blocking structures may be constructed of an elastomer, which is flexible. Metal components thin enough to be flexible can also be used. Alternatively, the flow channel is defined using a rigid perimeter structure that is rigid, for example, metal. These rigid perimeter structures are utilized when the flexible active area containing the plurality of pins is slightly larger than the device being cooled or the heat generating area of the device being cooled. The rigid perimeter structures are utilized along the edges, relying upon the flexibility of the active area between the flow blocker and the area needing to be cooled to absorb curvature differences between the rigid flow blocker and the area being cooled. In one embodiment, both flexible and rigid flow blockers are utilized. In addition to defining a single flow channel or active area, the flow blockers can be used to define a plurality of flow channels. In this embodiment, a plurality of separate groups of pins is forged into the flexible base plate. The flow blockers define a separate flow channel for each separate group of pins. At least one pair of cooling fluid inlets and outlets are disposed in the flexible top plate and are in communication with one of the separate flow channels.

In accordance with one exemplary embodiment, a compliant pin fin heat sink includes a flexible base plate, a plurality of pins extending from the flexible base plate and formed integral with the flexible base plate and a flexible top plate connected to and spaced from the flexible base plate. The plurality of pins is disposed between the flexible base plate and the flexible top plate. In one embodiment, the plurality of pins is forged in the flexible base plate. In one embodiment, the flexible based plate and the plurality of pins are copper. In one embodiment, the compliant pin fin sink is flexible under an applied load of from about 50 pounds to about 300 pounds in an area of the compliant pin fin sink containing the plurality of pins. In one embodiment, each pin in the plurality of pins extends from the flexible base plate a distance of from about 1 mm to about 5 mm. In one embodiment, the plurality of pins have a center to center spacing of from about 0.8 mm to about 2 mm and a diameter of from about 0.4 mm to about 1 mm.

In one embodiment, the flexible base plate has a length of about 50 mm and a width of about 50 mm, and the plurality of pins defines a rectangular area having 25 mm long sides. In one embodiment, a flow blocking structure is disposed between and in contact with the flexible base plate and the flexible top plate. The flow block structure defines a flow channel between the flexible base plate and the flexible top plate and the plurality of pins disposed in the flow channel. In one embodiment, the flow blocking structure is an elastomer. In one embodiment, the flexible top plate includes a liquid inlet and a liquid outlet passing through the flexible top plate. The liquid inlet and liquid outlet are in communication with the flow channel. In one embodiment, the plurality of pins is arranged in a plurality of separate groups of pins. The flow blocking structure includes a plurality of separate flow channels, and each one of the plurality of separate groups of pins is disposed in one of the plurality of separate flow channels. In one embodiment, the flexible top plate includes a plurality of liquid inlets and a plurality of liquid outlets passing through the flexible top plate. Each one of the plurality of separate flow channels is in communication with one of the plurality of liquid inlets and one of the plurality of liquid outlets.

In accordance with another exemplary embodiment, a compliant pin fin heat sink includes a flexible base plate having a thickness of from about 0.2 mm to about 0.5 mm, a plurality of pins extending from the flexible base plate and formed integral with the flexible base plate and a flexible top plate connected to and spaced from the flexible base plate. The plurality of pins is disposed between the flexible base plate and the flexible top plate. In one embodiment, the plurality of pins is forged in the flexible base plate. In one embodiment, the compliant pin fin heat sink includes a flow blocking structure disposed between and in contact with the flexible base plate and the flexible top plate. The flow block structure defines a flow channel between the flexible base plate and the flexible top plate and the plurality of pins disposed in the flow channel. The flexible top plate includes a liquid inlet and a liquid outlet passing through the flexible top plate. The liquid inlet and liquid outlet are in communication with the flow channel. In one embodiment, the flow blocking structure is an elastomer. In one embodiment, the plurality of pins is a plurality of separate groups of pins, and the flow blocking structure includes a plurality of separate flow channels. Each one of the plurality of separate groups of pins is disposed in one of the plurality of separate flow channels, and the flexible top plate includes a plurality of liquid inlets and a plurality of liquid outlets passing through the flexible top plate. Each one of the plurality of separate flow channels is in communication with one of the plurality of liquid inlets and one of the plurality of liquid outlets.

In accordance with another exemplary embodiment, a method for forming a compliant pin fin heat sink includes forging a plurality of pins in a flexible base plate made of copper and having a thickness of from about 0.2 mm to about 0.5 mm and connecting a flexible top plate to the base plate such that the plurality of pins is disposed between the flexible base plate and the flexible top plate. In one embodiment, forging the plurality of fins includes forging the pins to have a length of from about 1 mm to about 5 mm, a diameter of about 0.4 mm to about 1 mm and a center to center spacing of about 0.8 mm to about 2 mm. In one embodiment, the method also includes placing a flow blocking structure containing a flow channel between and in contact with the flexible base plate and the flexible top plate such that the plurality of pins is disposed in the flow channel. A liquid inlet and a liquid outlet are created through the flexible top plate. The liquid inlet and liquid outlet are in communication with the flow channel.

DETAILED DESCRIPTION

Figure 1:
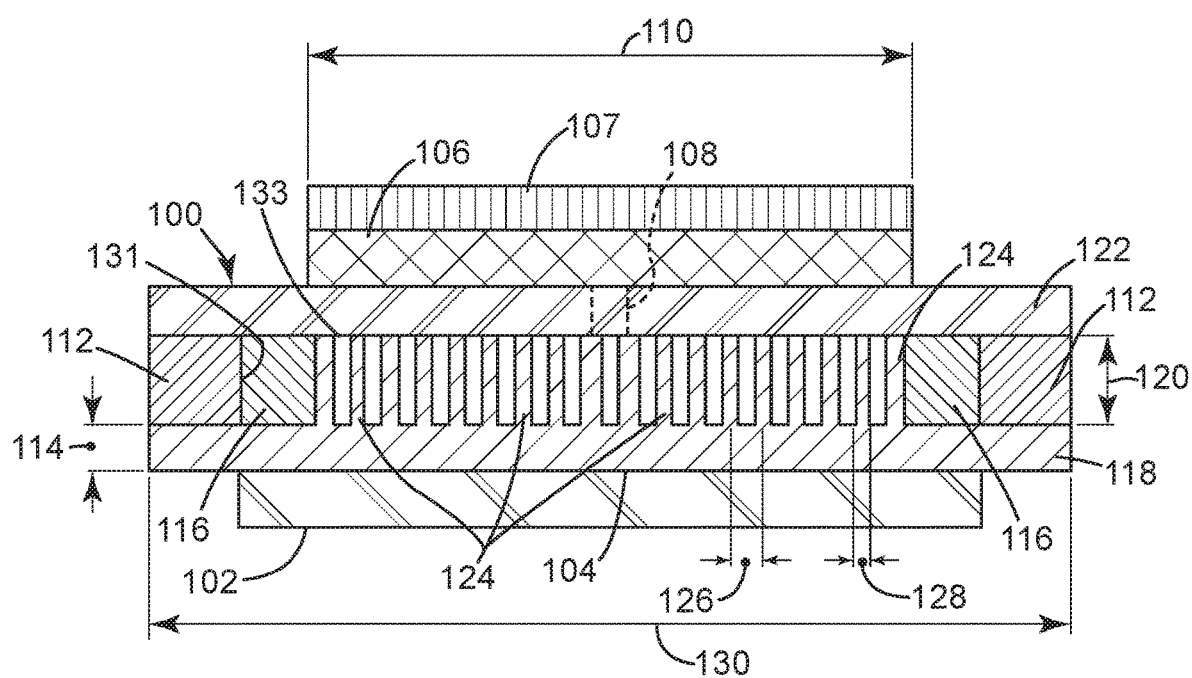
FIG. 1 is a representation of a cross section of an embodiment of a compliant pin fin heat sink between a load and a heat generating source.

Referring initially to FIG. 1, an embodiment of a compliant pin fin heat sink 100 is illustrated. The compliant pin fin heat sink is mounted on or placed in contact with a heat generating source 102. Suitable heat generating sources include, but at not limited to, any heat source or element that generates heat such as an integrated circuit, a chip, a multi-chip package, a single electrical component, multiple electrical components, an electronic device, multiple electronic devices and a heating element, e.g., in molding applications. The heat generating source can be formed on or mounted on a substrate as known and available in the art such as a printed wiring board, a cabinet structure and a wall of an architectural structure.

The top 104 or contact surface of the heat generating source is in contact with the compliant pin fin heat sink 100. This contact surface may not be smooth or flat. Therefore, the complaint pin fin heat sink has sufficient flexibility to conform to the shape of the contact surface. A mechanical load 106 is applied through a compressible layer 107 such as an elastomer to the compliant pin fin heat sink on a side opposite the heat generating source. This mechanical load is applied through the compliant pin fin heat sink in the direction of the heat generating source to conform the compliant pin fin heat sink to the contours of the contact surface. Suitable mechanical loads include from about 50 pounds to about 300 pounds. In another embodiment a thermal interface material (TIM) may be disposed between the device top surface and the compliant heat sink.

The complaint pin fin heat sink includes a flexible base plate 118. The flexible base plate has a thickness 114 of from about 0.2 mm to about 0.5 mm, which is near an order of magnitude thinner than the thickness of base plates in conventional heat sinks, i.e., from about 1 mm to about 5 mm. Suitable shapes for the flexible base plate include, but are not limited to, circular, oblong, triangular and rectangular. Preferably, the flexible base plate is square having a side dimension 130, which corresponds to both the length and width of the flexible base plate, of about 50 mm.

A plurality of individual pins 124 extend up from the flexible base plate. These pins are formed integral with the flexible base plate using any suitable method to form pins in a plate of material. Preferable, each pin is forged into the flexible base plate. Any suitable method for forging the pins that is known and available in the art can be used. Each pin in the plurality of pins extends from the flexible base plate a distance 120, i.e., has a length, of from about 1 mm to about 5 mm. In one embodiment, each pin has a length of about 3 mm. The pins are arranged in parallel lines to form a grid pattern where the plurality of pins have a center to center spacing 126 between any two adjacent pins in any row or across rows of from about 0.8 mm to about 2 mm. In one embodiment, the center to center spacing is about 1 mm. In one embodiment, each pin has a generally cylindrical shape and a circular cross section, although other cross sectional shapes can be used to improve flow, increase surface area for heat transfer or decrease drag. In one embodiment, each pin has a diameter 128 of from about 0.4 mm to about 1 mm. Preferably, each pin has a diameter of about 0.6 mm. The plurality of pins is arranged in an area having circular, elongated, triangular or rectangular shape. In one embodiment, the area is a square area having sides, i.e., length and width, that are about 25 mm long.

Figure 2:
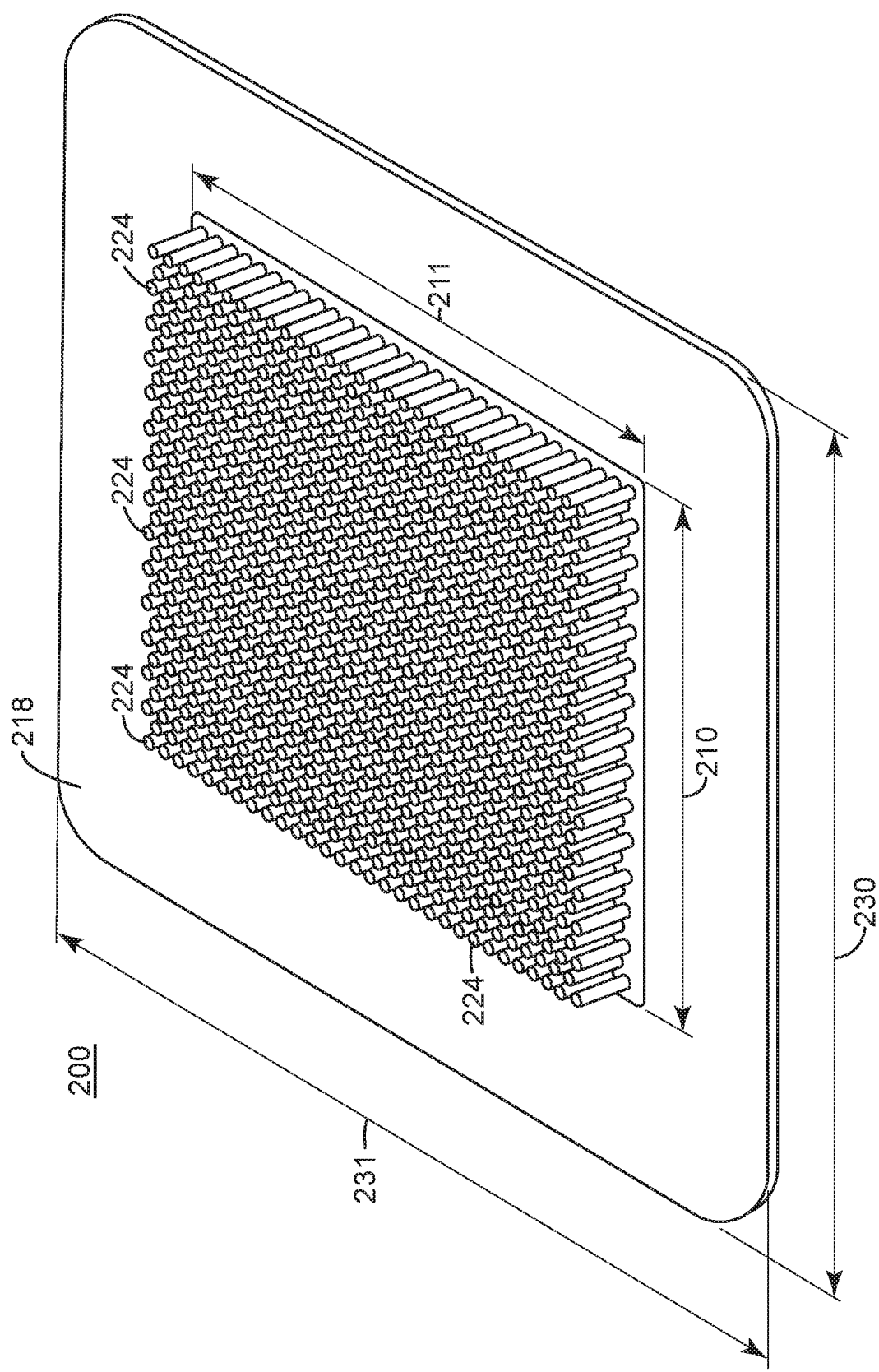
FIG. 2 is a perspective top view of an embodiment of a flexible base plate with forged pins.

Referring to FIG. 2, an arrangement of the flexible base plate with integrated pins 200 is illustrated. The flexible base plate 218 is square, having an equal length 230 and width 231. The plurality of pins 224 extend up from the flexible base plate in a square arrangement having an equal length 210 and width 211. This square arrangement of pins is centered on the square shaped flexible base plate. This leaves an area of flexible base plate around the plurality of pins. The plurality of pins are preferably arranged in rows, and each row is preferably offset from the two adjacent rows, i.e., the pins of the next row are disposed in the gaps between the pins in the previous row. This creates a tortuous path through the plurality of pines for the cooling fluid, eliminating open passages through the plurality of pins through which the cooling fluid could pass without contacting the pins. Suitable materials for the flexible base plate and pins include any adequately thermally conducting metal. Preferably, the flexible base plate and pins are copper. This square shape would be for a heat generating device with a substantially square top surface.

Returning to FIG. 1, the compliant pin fin heat sink also includes a flexible top plate 122. The flexible top plate is connected to and spaced from the flexible base plate. The flexible top plate can be directly connected to the flexible base plate or spaced from the flexible base plate by a rim or plurality of sides 112. In one embodiment, the rim or plurality of sides are formed integral with at least one of the flexible top plate and the flexible base plate. The rim or plurality of sides spaces the flexible top plate from the flexible base plate to define a space or gap 131. The plurality of pins is disposed between the flexible base plate and the flexible top plate in this gap. The pins extend from the flexible base plate toward the flexible top plate and can be spaced from the flexible top plate or in contact with the flexible top plate. In one embodiment, the pins are connected to the flexible top plate using any suitable method such as brazing or soldering. Suitable materials, flexibility, shapes and sizes for the flexible top plate are the same as for the flexible base plate. In general, the compliant pin fin sink including the flexible top plate and flexible base plate is flexible under an applied load in an area of the compliant pin fin sink containing the plurality of pins. This applied load can typically be from about 50 pounds to about 300 pounds.

The flexible top plate can also include one or more passages 108, i.e., liquid inlets and liquid outlets, passing completely through the flexible top plate in communication with the space 131 to facilitate introduction of the coolant liquid into the space for contact with the plurality of pins. Suitable coolant liquids include, but are not limited to, gases and liquids such as water, a solution of ethylene glycol, diethylene glycol, or propylene glycol in water, deionized water, polyalkylene glycol, cutting fluid, oils and low boiling point liquids such as refrigerants. Inlets and outlets may alternatively be located at other points in the heat sink including the sides or bottom surface outside the contact area.

In one embodiment, the compliant pin fin heat sink includes at least one flow blocking structure 116 disposed between and in contact with the flexible base plate and the flexible top plate, e.g., within the space or gap 131. The flow blocking structure can be a unitary structure or can be constructed from a plurality of sub-structures. The flow block structure defines a flow channel 133 between the flexible base plate and the flexible top plate and the plurality of pins disposed in the flow channel. The flow channel is configured and sized to prevent or minimize passage of the coolant fluid around the plurality of pins. The flow blocking structure can be constructed for a rigid material such as copper or a flexible material. In one embodiment, the flow blocking structure is an elastomer. When the flow blocking structure is located over or within the heat generating source 102, a flexible material is used as the compliant pin fin heat sink will flex in this area. When the flow blocking material is well outside the heat generating source (for example 1 mm or more), a rigid material, e.g., a metal or hard plastic, can be used.

Figure 3:
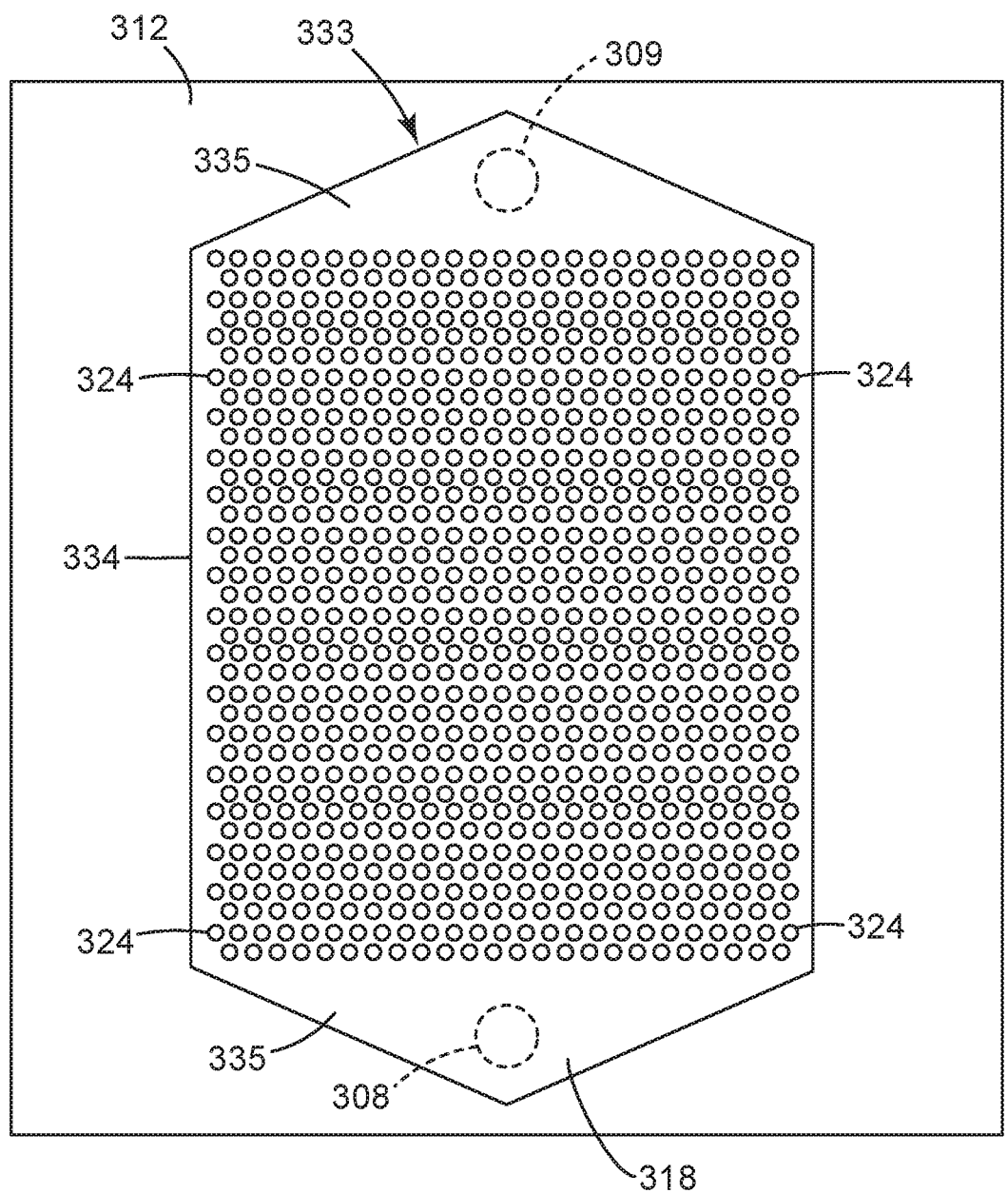
FIG. 3 is a representation of an embodiment of a flow blocking material on a flexible base plate with the pins disposed in a flow channel.

Referring to FIG. 3, an embodiment of the flow blocking material 312 placed on the flexible base plate 318 is illustrated. The flow blocking material has the same dimensions, length and width, as the flexible base plate. As illustrated, the flow blocking material is a unitary structure and has a single flow channel 333. The plurality of pins 324 are disposed in the flow channel, which includes a main rectangular or square section 334 containing the pins and two adjacent extended areas 335 on either side of the pins to provide for the flow of the coolant fluid. The flexible top plate liquid (not shown) inlet 308 and liquid outlet 309 that pass through the flexible top plate are disposed in the extended areas and are in communication with the flow channel.

Figure 4:
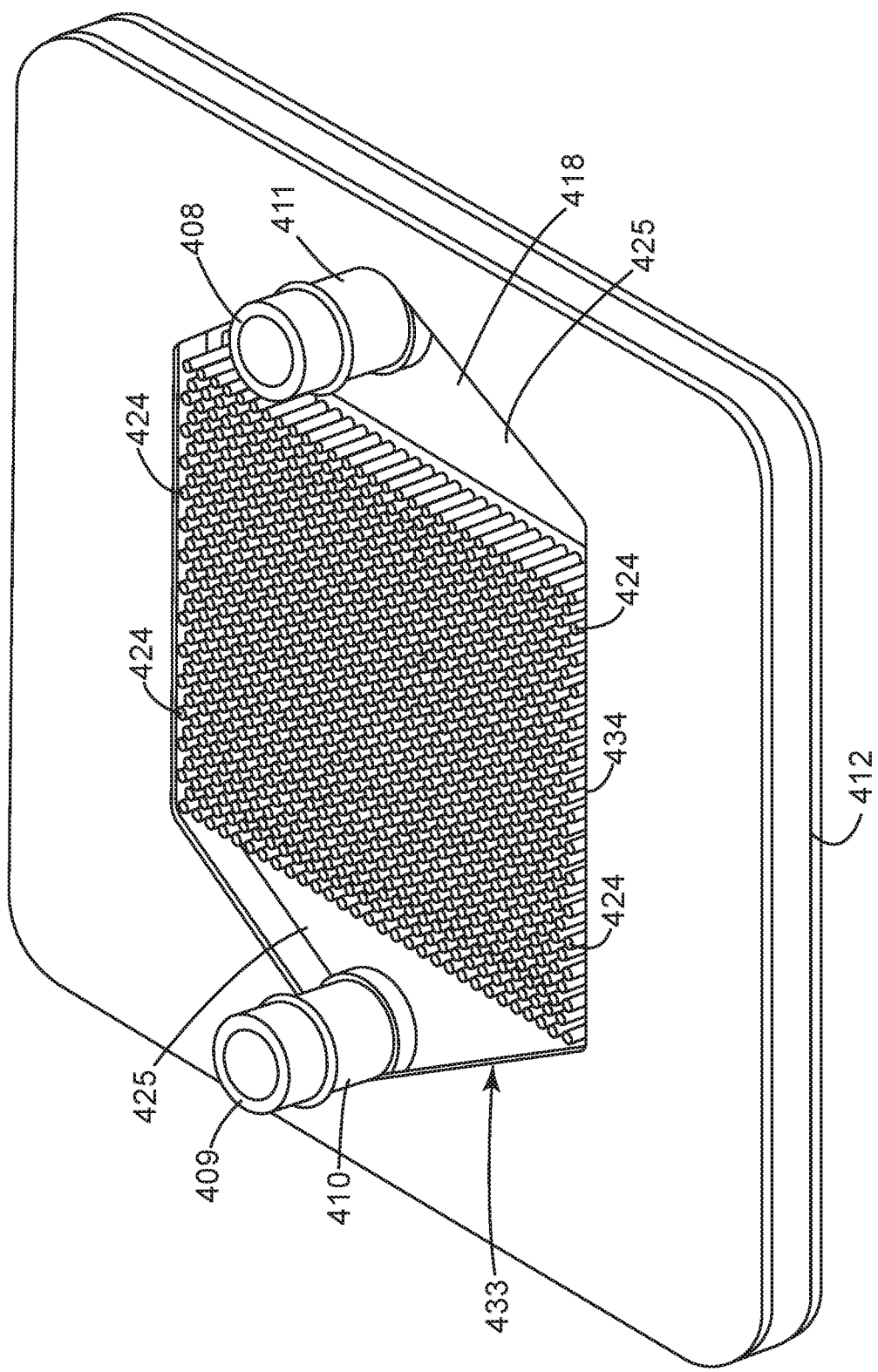
FIG. 4 is a perspective top view of another embodiment of a flow blocking material on a flexible base plate with the pins disposed in a flow channel.

Referring to FIG. 4, another embodiment of the flow blocking material 412 placed on the flexible base plate 418 is illustrated. The flow blocking material has the same dimensions, length and width, as the flexible base plate. As illustrated, the flow blocking material is a unitary structure and has a single flow channel 433. The plurality of pins 424 are disposed in the flow channel, which includes a main rectangular or square section 434 containing the pins and two adjacent extended areas 425 on either side of the pins to provide for the flow of the coolant fluid. The flexible top plate (not shown) liquid inlet 408 and liquid outlet 409 that pass through the flexible top plate are disposed in the extended areas and are in communication with the flow channel. The liquid inlet 408 includes a liquid inlet fitting 411, and the liquid outlet 409 includes an outlet fitting 410. These fittings provide for connecting to a plumbing system for delivery, collections and circulation of the cooling fluid. Any suitable plumbing fitting for handling coolant fluid can be used.

Figure 5:
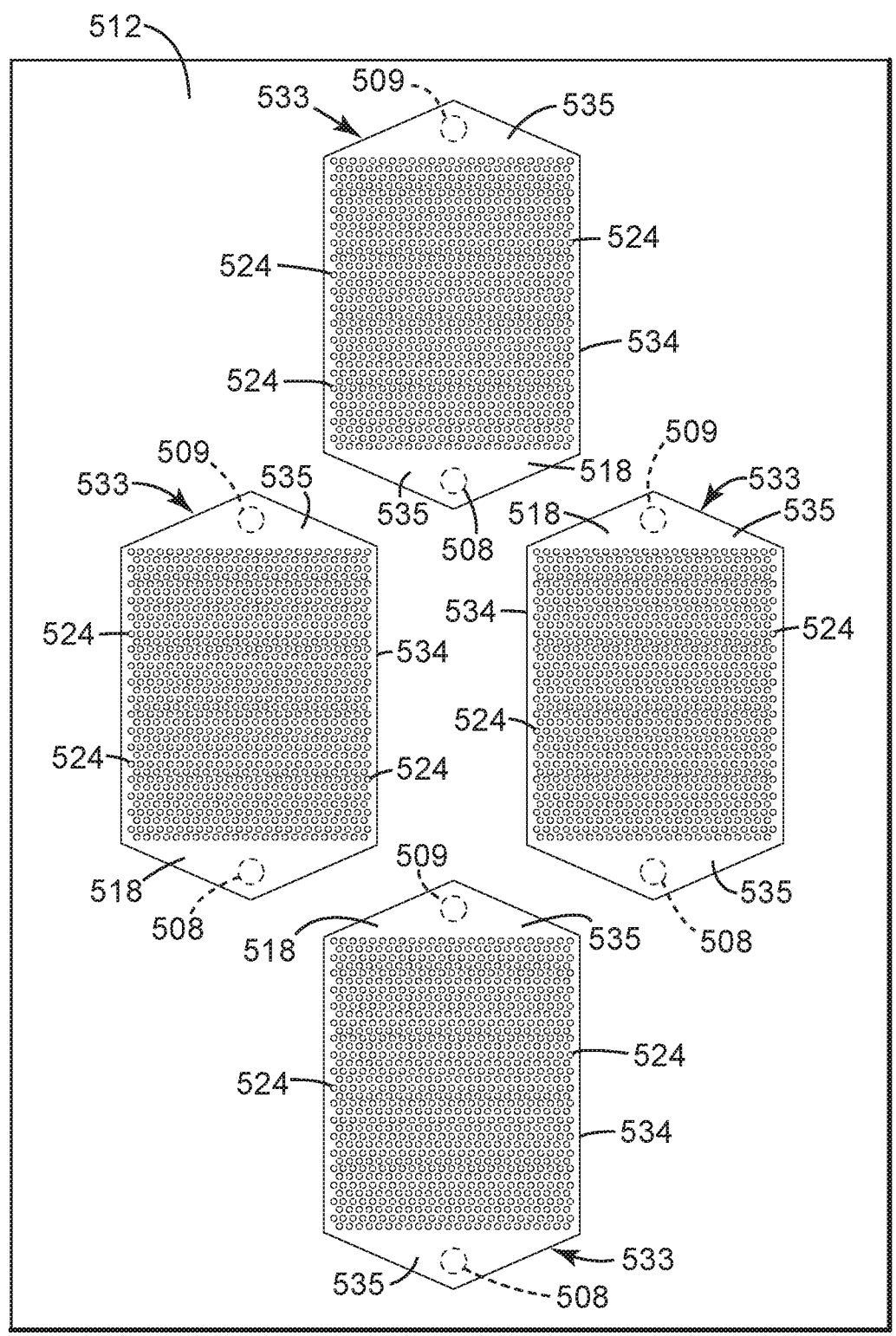
FIG. 5 is an illustration of an embodiment of a flow blocking material on a flexible base plate with groups of pins disposed in multiple flow channels.

Referring to FIG. 5, another embodiment of the compliant pin fin heat sink is illustrated in which the plurality of pins 524 are formed or arranged on the flexible base plate as a plurality of separate groups of pins. These groups can be on a single flexible base plate or a plurality of separate flexible base plates. The flow blocking material 512 placed on the flexible base plate 518 and has the same dimensions, length and width, as the flexible base plate. As illustrated, the flow blocking material is a unitary structure and has a plurality of separate flow channels 533. Each one of the plurality of separate groups of pins 524 is disposed in one of the plurality of separate flow channels, which each include a main rectangular or square section 534 containing the pins and two adjacent extended areas 535 on either side of the pins to provide for the flow of the coolant fluid. The flexible top plate (not shown) includes a plurality of liquid inlets 508 and a plurality of liquid outlets 509 passing through the flexible top plate. Each one of the plurality of separate flow channels is in communication with one of the plurality of liquid inlets and one of the plurality of liquid outlets. In particular, each liquid inlet 508 and liquid outlet 509 passes through the flexible top plate in the extended areas and is in communication with the flow channel. The plurality of groups of pins can be used to provide addition coverage for a larger heat generating source. Alternatively, each group of pins can be positioned for a particular heat generating source in an arrangement of a plurality of heat generating sources.

Figure 6:
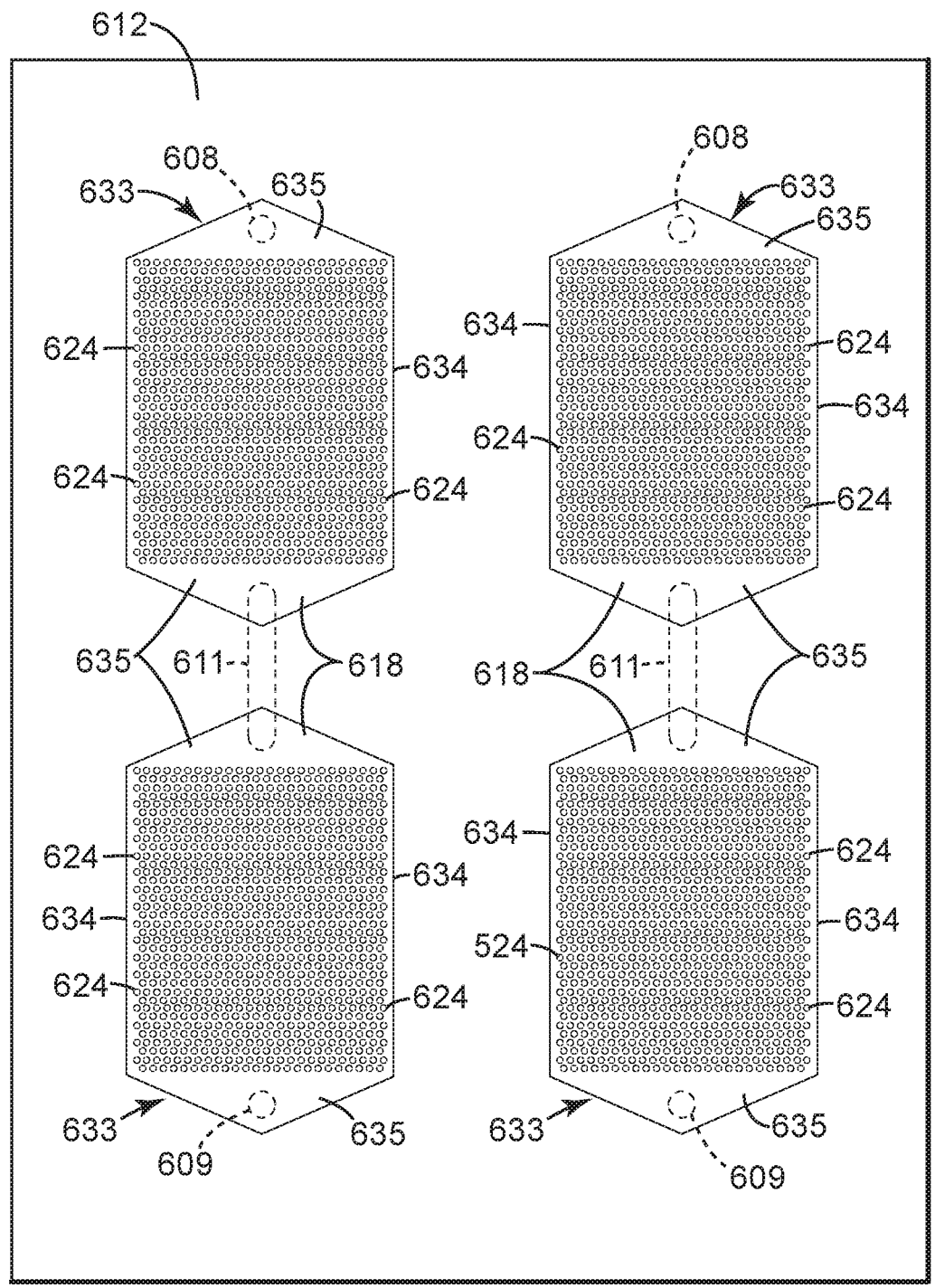
FIG. 6 is an illustration of another embodiment of a flow blocking material on a flexible base plate with groups of pins disposed in multiple flow channels.

Referring to FIG. 6, another embodiment of the compliant pin fin heat sink is illustrated in which the plurality of pins 624 are formed or arranged on the flexible base plate as a plurality of separate groups of pins. These groups can be on a single flexible base plate or a plurality of separate flexible base plates. The flow blocking material 612 placed on the flexible base plate 618 and has the same dimensions, length and width, as the flexible base plate. As illustrated, the flow blocking material is a unitary structure and has a plurality of separate flow channels 633. Each one of the plurality of separate groups of pins 624 is disposed in one of the plurality of separate flow channels, which each include a main rectangular or square section 634 containing the pins and two adjacent extended areas 635 on either side of the pins to provide for the flow of the coolant fluid. The flexible top plate (not shown) includes a plurality of liquid inlets 608 and a plurality of liquid outlets 609 passing through the flexible top plate. Each one of the plurality of separate flow channels is in communication with one of the plurality of liquid inlets and one of the plurality of liquid outlets. In particular, each liquid inlet 608 and liquid outlet 609 passes through the flexible top plate in the extended areas and is in communication with the flow channel. As illustrated, the plurality of pins and flows channels are arranged in series. Two parallel series of two flow channels each are illustrated. However, all flow channels within the flow blocking material can be arranged in a single series. Each series has a given associated liquid inlet and liquid outlet. Adjacent flow channels in the series are in fluid communication through at least one connecting channel 611. The plurality of groups of pins can be used to provide addition coverage for a larger heat generating source. Alternatively, each group of pins can be positioned for a particular heat generating source in an arrangement of a plurality of heat generating sources.

Figure 7:
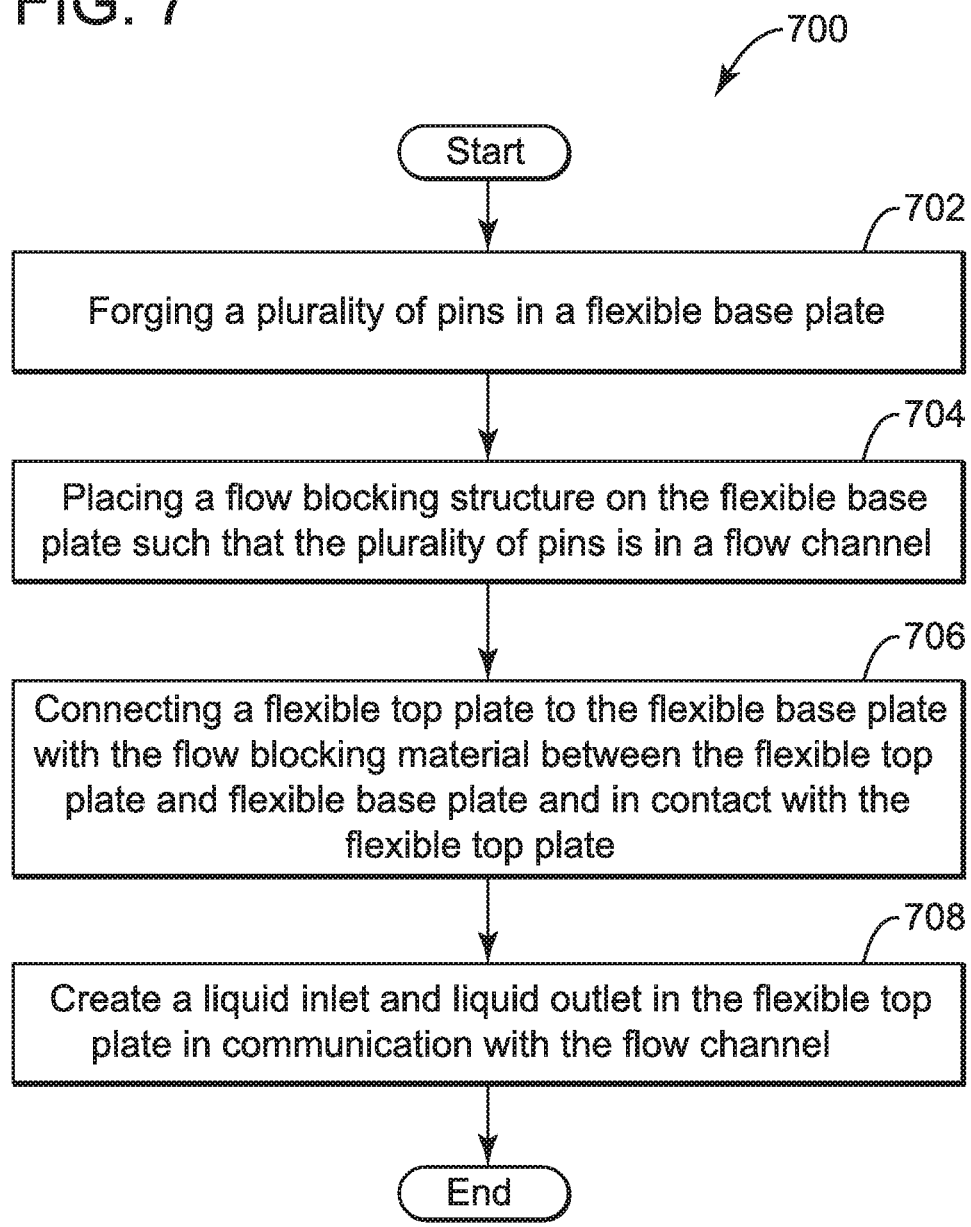
FIG. 7 is a flow chart illustrating an embodiment of a method for forming a compliant pin fin heat sink.

Referring to FIG. 7, an embodiment is directed to a method for forming a compliant pin fin heat sink 700. A plurality of pins is forged in a flexible base plate 702. Alternatively, a plurality of separate groups or pins is forged in the flexible base plate. In one embodiment, the flexible base plate is copper and has a thickness of from about 0.2 mm to about 0.5 mm. The plurality of fins is forged to have a length of from about 1 mm to about 5 mm, a diameter of about 0.4 mm to about 1 mm and a center to center spacing of about 0.8 mm to about 2 mm. A flow blocking structure having a flow channel between is placed in contact with the flexible base plate such that the plurality of pins is disposed in the flow channel 704. A flexible top plate is connected to the base plate such that the plurality of pins and flow blocking structure is disposed between the flexible base plate and the flexible top plate and the flow blocking structure is in contact with the flexible top plate 706. A liquid inlet and a liquid outlet are created through the flexible top plate such that the liquid inlet and liquid outlet are in communication with the flow channel 708. Suitable arrangements and dimensions for the flexible top plate, flow blocking material, plurality of pins and flexible base plate are discussed herein.

While it is apparent that the illustrative embodiments of the invention disclosed herein fulfill the objectives of the present invention, it is appreciated that numerous modifications and other embodiments may be devised by those skilled in the art. Additionally, feature(s) and/or element(s) from any embodiment may be used singly or in combination with other embodiment(s) and steps or elements from methods in accordance with the present invention can be executed or performed in any suitable order. Therefore, it will be understood that the appended claims are intended to cover all such modifications and embodiments, which would come within the spirit and scope of the present invention.

What is claimed is:

1. A compliant pin fin heat sink comprising:
    a plurality of separate flexible base plates;
    a plurality of elastomeric flow blockers joining the plurality of separate flexible base plates;
    a plurality of pins extending from each of the flexible base plates and formed integral with each of the flexible base plates; and
    a flexible top plate connected to and spaced from the flexible base plates, the plurality of pins disposed between the flexible base plates and the flexible top plate and the flexible base plates and flexible top plate having a thickness of from 0.2 mm to 0.5 mm;
    wherein the compliant pin fin heat sink including the flexible top plate and the flexible base plates is flexible in an area of the compliant pin fin heat sink containing the plurality of pins to conform the compliant pin fin heat sink to contours of a contact surface under a load applied to the flexible top plate,
    wherein the plurality of elastomeric flow blockers define flow channels that enclose the plurality of pins between the flexible base plates and the flexible top plate,
    wherein each row of pins within each plurality of pins is offset from each adjacent row of pins within that plurality of pins.

2. The compliant pin fin heat sink of claim 1, wherein the plurality of pins are forged in the flexible base plate.

3. The compliant pin fin heat sink of claim 1, wherein the flexible base plates and the plurality of pins comprise copper.

4. The compliant pin fin heat sink of claim 1, wherein the compliant pin fin heat sink is flexible under an applied load of from 50 pounds to 300 pounds in an area of the compliant pin fin heat sink containing the plurality of pins.

5. The compliant pin fin heat sink of claim 1, wherein each pin in the plurality of pins extends from the flexible base plate a distance of from 1 mm to 5 mm.

6. The compliant pin fin heat sink of claim 1, wherein the plurality of pins comprise a center to center spacing of from 0.8 mm to 2 mm and a diameter of from 0.4 mm to 1 mm.

7. The compliant pin fin heat sink of claim 1, wherein:
    each of the plurality of flexible base plates comprises a length of 50 mm and a width of 50 mm; and
    the plurality of pins defines a rectangular area having 25 mm long sides.

8. The compliant pin fin heat sink of claim 1, wherein the flexible top plate comprises a plurality of liquid inlets and a plurality of liquid outlets passing through the flexible top plate, each one of the plurality of separate flow channels in communication with one of the plurality of liquid inlets and one of the plurality of liquid outlets.

9. A method for forming a compliant pin fin heat sink, the method comprising:

forging a plurality of pins in a plurality of flexible base plates comprising copper and having a thickness of from 0.2 mm to 0.5 mm;

attaching elastomeric flow blocking structures joining each of the plurality of flexible base plates to an adjacent flexible base plate to form a corresponding flow channel that encloses the plurality of pins on that base plate; and connecting to the base plate and to the pins a flexible top plate having a thickness of from 0.2 mm to 0.5 mm such that the plurality of pins is disposed between the flexible base plate and the flexible top plate;

wherein the compliant pin fin heat sink including the flexible top plate and the flexible base plates is flexible in an area of the compliant pin fin heat sink containing the plurality of pins to conform the compliant pin fin heat sink to contours of a contact surface under a load applied to the flexible top plate.

10. The method of claim 9, wherein forging the plurality of fins further comprises forging the pins to have a length of from 1 mm to 5 mm, a diameter of 0.4 mm to 1 mm and a center to center spacing of 0.8 mm to 2 mm.

* * * * *